(12) United States Patent
Yang et al.

(10) Patent No.: US 7,504,335 B2
(45) Date of Patent: Mar. 17, 2009

(54) GRAFTED SEED LAYER FOR ELECTROCHEMICAL PLATING

(75) Inventors: Michael Yang, Palo Alto, CA (US);
Aron Rosenfeld, Palo Alto, CA (US);
Hooman Hafezi, Redwood City, CA (US); Zhi-Wen Sun, San Jose, CA (US);
John Dukovic, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 233 days.

(21) Appl. No.: 11/404,058

(22) Filed: Apr. 13, 2006

(65) Prior Publication Data

US 2007/0052104 A1    Mar. 8, 2007

Related U.S. Application Data

(60) Provisional application No. 60/673,920, filed on Apr. 22, 2005, provisional application No. 60/671,253, filed on Apr. 13, 2005.

(51) Int. Cl.
*H01L 21/44* (2006.01)

(52) U.S. Cl. ............. 438/672; 438/687; 257/758
(58) Field of Classification Search ........... 257/758; 438/672, 687
See application file for complete search history.

(56) References Cited

U.S. PATENT DOCUMENTS

| 5,930,669 | A | * | 7/1999 | Uzoh | ............ | 438/627 |
| 6,130,156 | A | * | 10/2000 | Havemann et al. | ......... | 438/637 |
| 2006/0141156 | A1 | * | 6/2006 | Viel et al. | .................. | 427/258 |

* cited by examiner

*Primary Examiner*—Phat X Cao
(74) *Attorney, Agent, or Firm*—Patterson & Sheridan

(57) ABSTRACT

Generally, the process includes depositing a barrier layer and seed layer on a feature formed in a dielectric layer, performing a grafting process, initiating a copper layer and then filing the feature by use of a bulk copper fill process. Copper features formed according to aspects described herein have desirable adhesion properties to a barrier and seed layers formed on a semiconductor substrate and demonstrate enhanced electromigration and stress migration results in the fabricated devices formed on the substrate.

14 Claims, 3 Drawing Sheets

GRAFTED SEED LAYER FOR ELECTROCHEMICAL PLATING

CROSS-REFERENCE TO RELATED APPLICATIONS

This application claims benefit of U.S. Provisional Patent Application Ser. No. 60/671,253 filed Apr. 13, 2005 and U.S. Provisional Patent Application Ser. No. 60/673,920 filed Apr. 22, 2005, which are herein incorporated by reference.

BACKGROUND OF THE INVENTION

1. Field of the Invention

Embodiments of the invention generally relate to a method for barrier layer surface treatment to enable direct copper plating on discontinuous seed layer.

2. Description of the Related Art

Sub-quarter micron, multi-level metallization is one of the key technologies for the next generation of very large scale integration (VLSI) and ultra large scale integration (ULSI) semiconductor devices. The multilevel interconnects that lie at the heart of this technology require the filling of contacts, vias, lines, and other features formed in high aspect ratio apertures. Reliable formation of these features is very important to the success of both VLSI and ULSI as well as to the continued effort to increase circuit density and quality on individual substrates and die.

As circuit densities increase, the widths of contacts, vias, lines and other features, as well as the dielectric materials between them, are continually decreasing as the device feature sizes decrease from 65 nm to 32 nm and beyond. Many conventional deposition processes do not consistently fill structures with narrow openings or difficult aspect ratios. As such, there is a great amount of ongoing effort being directed at the void-free filling of nanometer-sized structures with narrow opening and/or high aspect ratios features wherein the ratio of feature height to feature width could be 4:1 or higher.

Additionally, as the feature widths decrease, the device current typically remains constant or increases, which results in an increased current density for such features. Elemental aluminum and aluminum alloys have been the traditional metals used to form vias and lines in semiconductor devices because aluminum has a low electrical resistivity, superior adhesion to most dielectric materials, and ease of patterning, and the aluminum in a highly pure form is readily available. However, aluminum has a higher electrical resistivity than other more conductive metals, such as copper (Cu). Aluminum can also suffer from electromigration, leading to the formation of voids in the conductor.

Copper and copper alloys have lower resistivities than aluminum, as well as a significantly higher electromigration resistance compared to aluminum. These characteristics are important for supporting the higher current densities experienced at high levels of integration and increased device speed. Copper also has good thermal conductivity. Therefore, copper is becoming a choice metal for filling sub-quarter micron, high aspect ratio interconnect features on semiconductor substrates.

Conventionally, deposition techniques such as chemical vapor deposition (CVD) and physical vapor deposition (PVD) have been used to fill these interconnect features. However, as the interconnect sizes decrease and aspect ratios increase, void-free interconnect feature fill by conventional metallization techniques becomes increasingly difficult using CVD and/or PVD. As a result thereof, plating techniques, such as electrochemical plating (ECP), have emerged as viable processes for filling sub-quarter micron sized high aspect ratio interconnect features in integrated circuit manufacturing processes.

Most ECP processes generally involve a two-stage process, wherein a seed layer is first formed over the surface of features on the substrate using a non-ECP type process, and then the surface of the features is exposed to an electrolyte solution while an electrical bias is simultaneously applied between the substrate surface and an anode positioned within the electrolyte solution.

Conventional plating practices include depositing a copper seed layer by physical vapor deposition (PVD), chemical vapor deposition (CVD), or atomic layer deposition (ALD) onto a diffusion barrier layer (e.g., tantalum or tantalum nitride). However, as the feature sizes become smaller, thickness of the seed layer must be reduced and thus it may become difficult to have adequate seed step coverage with PVD techniques, as discontinuous islands of copper or copper agglomerates are often obtained in the feature side walls close to the feature bottom. The thick copper layer on the field can cause the throat of the feature to close before the feature sidewalls are completely covered. When using CVD or ALD deposited barrier and/or seed layer films in place of a PVD deposited barrier and/or seed layer, typically adhesion problems arise due to the incorporation of the chemical precursor used in the CVD and ALD process in the deposited film. When the deposition thickness on the field is reduced to prevent throat closure, discontinuities are likely to appear in the seed layer. These discontinuities in the seed layer have been shown to directly cause voids, generate plating defects in the layers plated over the seed layer, and induce improper adhesion of the deposited layer to the oxidized barrier. In addition, copper tends to oxidize readily in the atmosphere and copper oxide readily dissolves in the plating solution. To prevent agglomeration or complete dissolution of copper in the features, the copper seed layer is usually made relatively thick (in mid hundreds angstroms), which can inhibit the plating process from filling the features. Therefore, it is desirable to have a copper plating process that allows forming a void-free copper fill layer on discontinuous, agglomerated and/or oxidized seed layer that adheres to the copper seed and barrier layer(s).

Therefore, there is a need for a copper plating process that can fill features that contain a barrier and a discontinuous copper seed layer.

SUMMARY OF THE INVENTION

The present invention provides methods for filling features on a substrate surface using electrochemical plating.

One embodiment of the present invention provides a method for filling a feature on a substrate surface. The method comprises forming a copper seed layer on the substrate surface, grafting an organic layer on the copper seed layer, and filling the feature on the substrate surface with copper.

Another embodiment of the present invention provides a method of filling a feature formed on a substrate surface. The method comprises forming a barrier layer on the substrate surface, forming a copper seed layer on the barrier layer, grafting an organic layer on the copper seed layer, initiating a copper layer on the substrate, and filling the feature on the substrate surface with copper.

Yet another embodiment of the present invention provides a method for depositing a copper layer on a substrate surface. The method comprises depositing a barrier layer and a copper seed layer on the substrate surface, grafting an organic layer on the substrate surface, and electroplating copper on the substrate surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1A:
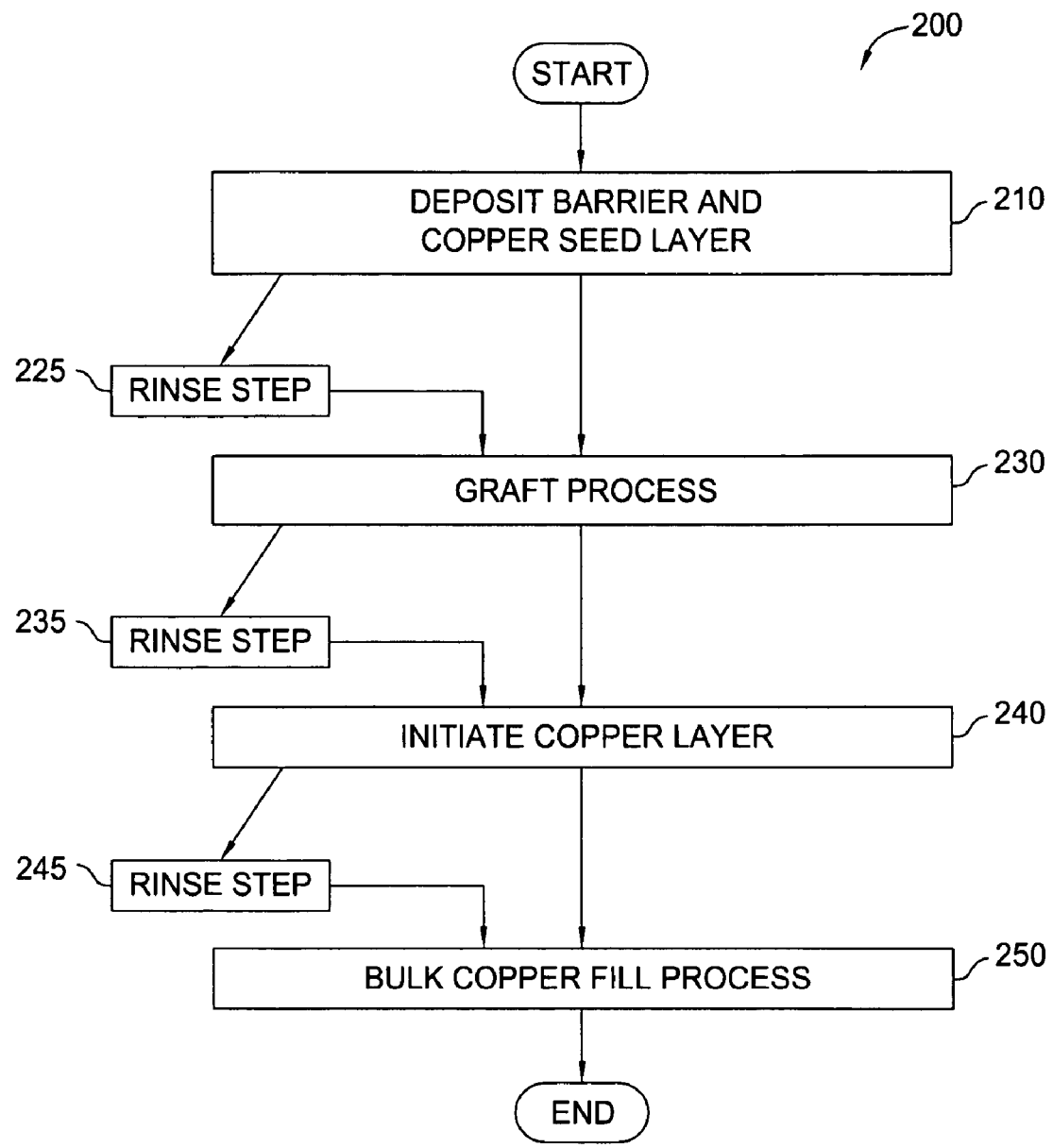
FIG. 1A is an illustration of process of performing one embodiment of the invention described herein.

FIG. 1A illustrates one embodiment of a process 200 that can be used to form a copper feature, such as interconnects that have desirable adhesion properties to a barrier layer and copper seed layer formed on a semiconductor substrate. Generally, the process includes depositing a barrier layer and seed layer on a feature formed in a dielectric layer, performing an electro-grafting process, initiating a copper layer and then filling the feature by use of a bulk copper. fill process. Copper features formed according to aspects described herein have desirable adhesion properties to a barrier and seed layers formed on a semiconductor substrate and demonstrate enhanced electromigration and stress migration results in the fabricated devices formed on the substrate.

Referring to FIG. 1A, the first process step 210, in the process 200 is to deposit a barrier and copper seed on a substrate that contains features formed on the surface of a dielectric layer. The barrier layer typically includes a refractory metal nitride and/or silicide, such as nitrides or suicides of titanium (Ti), tungsten (W) or tantalum (Ta). Of this group, tantalum nitride is one of the most desirable materials for use as a barrier layer. Tantalum nitride (TaN) provides a good barrier to copper diffusion, even when relatively thin layers are formed (e.g., 20 Å or less). A tantalum nitride layer is typically deposited by conventional deposition techniques, such as physical vapor deposition (PVD), atomic layer deposition (ALD), and chemical vapor deposition (CVD). Typical barrier and liner layers used in integrated circuit interconnects and metallization layers include Ta/TaN, Ti/TiN, W/WN and Ti—W layers.

Also, in the process step 210 a copper seed layer is deposited on the barrier layer by conventional deposition techniques, such as physical vapor deposition (PVD), atomic layer deposition (ALD), electroless, and chemical vapor deposition (CVD). The problem arises where the seed layer deposition process is performed on high aspect ratio features, or the seed layer needs to be rather thin, which leads to voids on the sidewalls or bottom of the features. In typical device fabrication process sequences, using an electroplating bulk fill process on a discontinuous seed layer, forms a layer that can have device reliability problems due to adhesion issues which can cause electromigration and stress migration problems. The adhesion problem typically arises since the exposed barrier layer, in the areas where there is a discontinuous seed layer, may rapidly oxidize thus preventing a bond from forming between the electroplated copper layer and the exposed barrier layer, or the barrier layer material, by its very nature, may prevent subsequent layers from forming a strong bond to its surface. For example, when a Tantalum layer is deposited on the TaN layer to promote adhesion of the subsequent layers, the issue that arises is that Ta readily oxidizes which affects the ability of the subsequent layers to bond to the barrier layer(s).

Process step 230, or the chemical grafting or electro-grafting process, can be performed on the substrate to form an adhesion layer from which to help bond the subsequent metal layers. The process of chemical grafting or electro-grafting generally includes exposing a surface of the substrate to an organic molecule that goes through a reduction process due to the interaction with an exposed layer on a substrate and forms a strong bond with the exposed layer. The grafted layer subsequently forms strong bonds with Cu. It is believed that the strong bonds promote the adhesion of the subsequent layers to the grafted layer and between the grafted layer and the layers below. Typical grafting organic molecules include diazonium salts (e.g., nitro-benzenediazonium tetrafluoroborate, carboxyl-benzenediazonium tetrafluoroborate, ethylamino-benzenediazonium tetrafluoroborate or other various benzenediazonium tetrafluoroborate salts) and vinyl-monomers (e.g., acrylonitrile, methacrylonitrile, vinylpyridine, methyl methacrylate, other electron deficient alkenes). Carboxyl-benzenediazonium tetrafluoroborate and ethylamino-benzenediazonium tetrafluoroborate may complex Cu or promote subsequent Cu plating and are preferred to get strong adhesion.

During grafting process 230, the copper seed may act as catalyst to promote the grafting reaction. For example, when using nitro-benzenediazonium tetrafluoroborate, a copper seed atom first provide an electron for reduction of diazonium cation to form aryl radical and $N_2$. The aryl radical then reacts with the copper surface. It is believed that the space between copper islands is then spanned by bridging diazonium network which is robust enough for good adhesion Process step 230 may be performed in two main ways. In the first method, or chemical grafting method, the surface of the substrate that contains the barrier and seed layer is exposed to a solution containing a concentration of the grafting molecule, (e.g., organic diazonium salt or vinyl-monomer) during a spin-on type deposition process in a spin-rinse and dry chamber (SRD) useful to perform this process is available from Applied Materials Inc., of Santa Clara, Calif. In this process, a desired amount of the solution is deposited on the surface of the substrate as the substrate is being rotated to assure coverage and uniformity of the deposited layer. During the chemical grafting process, the organic molecules are spread across the surface of the substrate and react to form a bond to the exposed seed and barrier layers.

A second method of performing process step 230 includes inserting the substrate into a plating cell, such as a Slim-Cell plating cell available from Applied Materials and performing an electrodeposition process on the substrate. The electrodeposition process is completed by making electrical contact with the surface of the substrate, which contains the barrier and seed layer, immersing the substrate in a grafting process solution containing a concentration of the grafting organic molecule (e.g., various diazonium salt) and cathodically biasing the substrate surface using a power supply relative to an electrode submersed in, or in electrical communication with, the electro-grafting process solution. After biasing the substrate for a desired period of time, the process is stopped. In one aspect of the process, the flow rate of the grafting process solution, the pH of the grafting process solution, the concentration of the grafting organic molecules in the grafting process solution, the temperature of the grafting process solution, and the electrical waveform delivered to the substrate is controlled to optimize the grafting process.

In process step 240, an initial copper deposition step is performed. In one aspect of the invention, where the grafting process is performed electrolytically, the initial copper deposition step 240 is combined with step 230 and performed by immersing the substrate in the same bath as the electrografting step that contains a concentration of Cu, and then biasing the substrate surface at one potential to start the grafting process in process step 230 and then biasing the substrate at a another potential (e.g., higher potential) to initiate the copper growth on the grafted layer to perform step 240.

In another embodiment of process step 240, where the grafting process is not performed electrolytically (e.g., chemical grafting) or the electrografting processing solution is not desirable to perform the initial copper deposition step, process step 240 may be performed by immersing the substrate in a separate processing solution that contains copper ions, after the grafting process has been performed, and then biasing the substrate at a cathodic potential to initiate the copper growth on the grafted layer.

In process step 250, a copper bulk-fill deposition step is performed on the substrate. In one aspect, the bulk fill process is performed in a different process chamber using a different chemistry than the one used in process step 240. The bulk fill process will generally use conventional copper electroplating solutions containing accelerators, suppressors and levelers as required to complete the bulk fill process step. In another aspect, steps 240 and 250 are combined when step 240 is carried out separately with step 230.

One or more rinse steps, such as process step 235 and process step 245, may be added to the process sequence to remove any unwanted materials that may reside on the substrate surface from the prior processes. A typical rinse solution may include deionized water, or deionized water containing hydrofluoric acid (HF) or other fluorine containing acids. A typical rinse process may include spraying the surface of the substrate with the rinse solution while the substrate is being rotated.

Figure 1B:
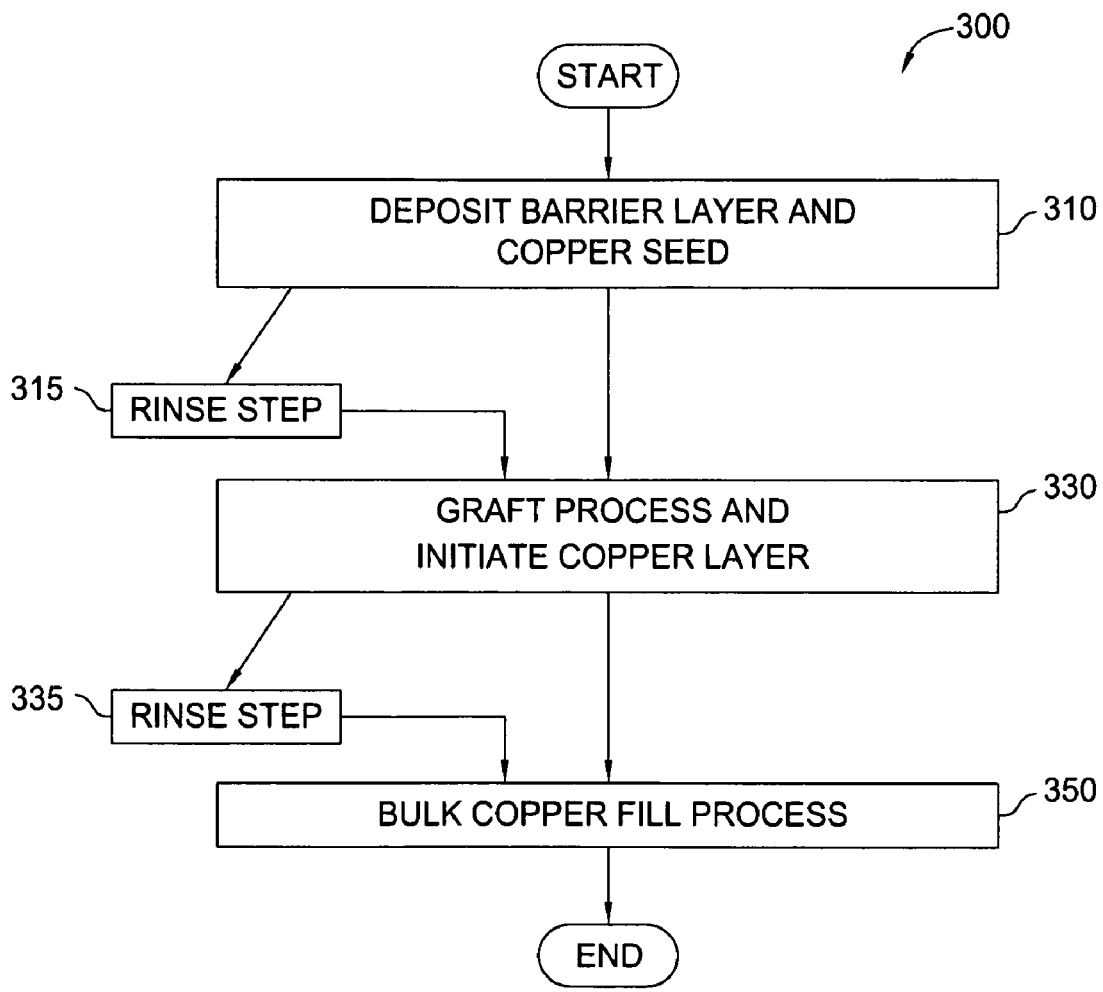
FIG. 1B is an illustration of process of performing one embodiment of the invention described herein.

FIG. 1B illustrates another embodiment of present invention. In process 300, grafting process and initiation of copper layer are performed in a single process step 330. In one aspect, step 330 may be performed by immersing the substrate with a barrier layer and copper seed layer in a grafting process solution to form an adhesion layer, then cathodically biasing the substrate while it is immersed in the grafting process solution to initiate the growth of copper onto to the copper seed layer and the adhesion layer. In another aspect of the invention, where the grafting process is performed electrolytically, process step 330 may be performed by holding the substrate at one potential to start the electro-grafting process and then biasing the substrate at another potential (e.g., higher potential) to initiate the copper growth on the grafted layer.

Figure 1C:
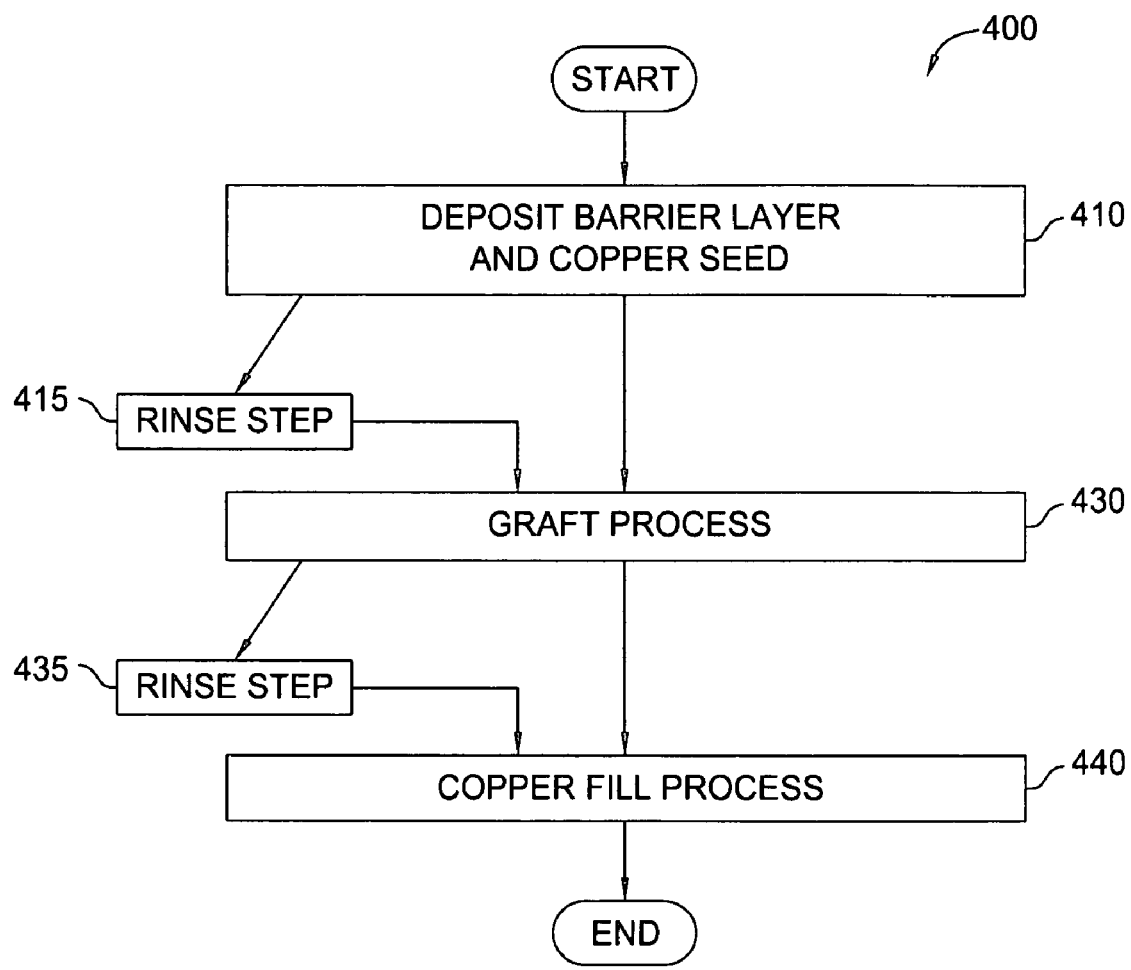
FIG. 1C is an illustration of process of performing one embodiment of the invention described herein.

FIG. 1C illustrates yet another embodiment of present invention, where initiate copper layer step 240 on the grafted layer and copper bulk filling step 250, shown in FIG. 1A are performed in one process step 440. In one aspect, the two stage copper deposition process can be performed in the same electroplating chamber and use the same process chemistry. In another aspect, the process parameters, such as the current density of cathodic bias, can be adjusted to different values before, during or after the initial copper layer is formed to improve the film properties.

Immersion Bias

In one aspect of the invention, grafting techniques can be used to remove the need to bias the substrate during immersion in the electroplating bath. The bias applied to the substrate during the immersion step is used to prevent the seed layer from being etched during the process of immersing the substrate in the electrolyte solution. The standard procedure for immersing a substrate with barrier and copper seed into a plating cell for subsequent electroplating, is to bias the wafer cathodically during the entry step, so-called "hot entry", to protect the copper seed from dissolution. Here the hot entry step refers to the period from just before the wafer touches the electrolyte surface and up to the time the substrate is positioned at its final orientation in the plating cell prior to performing the electroplating process. During this entry step, a substrate surface to electrolyte solution interface is formed which moves across the surface of the substrate as the substrate becomes completely immersed in the electrolyte solution. In some configurations various complicated transferring motions may be completed to quickly and repeatably immerse the substrate. These transfer motions include tilting or swinging the substrate into position. The hot entry phase of the immersion process may extend all the way until the substrate is in its final processing position or it may be terminated at some point in the immersion transferring motion.

During the hot entry phase, copper is deposited on the substrate surface. Copper deposition thus occurs, while the wafer is still in motion so that copper is being deposited while the substrate is at varying distance from the anode and also possibly in varying orientation with respect to the anode, due to the swing or tilt motion. Therefore, all parts of the substrate may not be disposed in the same orientation and position relative to the anode throughout the immersion process and so different areas of the substrate may receive different amounts of plating leading to a non-uniform thickness profile across the substrate. It is thus desirable to shorten the entry time and/or transition from the immersion bias to normal plating processes as quickly as possible. Nevertheless, there remains a need to address the thickness non-uniformities arising from the immersion step.

Moreover, as feature size continues to decrease with advancing technology nodes, the amount of plating occurring during the entry step is increasingly significant relative to the total amount of plating needed to fill the smaller feature. The constraint of hot entry, which is needed to protect the seed layer, does not allow early enough transition to a waveform appropriate to "superfill" or bottom-up fill the device features. The amount of plating occurring under the hot entry bias may be enough to already partially fill the feature with a conformal plating or even to begin forming a seam or pinching off the feature creating a void.

Therefore, it is desirable to avoid the hot entry entirely, allow the wafer to come to its final position in the plating cell before plating begins. Preferably, the plating process would begin with a waveform optimized for initiating rapid bottom-up fill without the need for any hot entry step.

In one embodiment, the above described grafting processes, may be used to protect the copper seed during the entry step so that the need for an entry bias is reduced or avoided all together. A thin organic film grafted onto the copper seed layer can be used to protect it against corrosion during the substrate immersion process and also facilitates subsequent electroplating processes. In one aspect, a grafted layer may be used to protect the exposed metal films during the immersion process.

While the foregoing is directed to embodiments of the present invention, other and further embodiments of the invention may be devised without departing from the basic scope thereof, and the scope thereof is determined by the claims that follow.

What is claimed:

1. A method for filling a feature on a substrate surface, comprising:
   forming a copper seed layer on the substrate surface;
   grafting an organic layer on the copper seed layer; and
   filling the feature on the substrate surface with copper.

2. The method of claim 1, wherein grafting the organic layer is performed by exposing the substrate surface to organic molecules.

3. The method of claim 2, wherein the grafting the organic layer comprises immersing the substrate in a grafting solution while biasing the substrate cathodically.

4. The method of claim 2, wherein the grafting the organic layer comprises spinning on the substrate surface a solution containing a concentration of grafting molecules.

5. The method of claim 2, wherein the organic molecules comprise one of a diazonium salt or a vinyl-monomer.

6. The method of claim 1, further comprising, prior to depositing the copper seed layer, depositing a barrier layer on the substrate surface.

7. The method of claim 1, wherein the copper seed layer is discontinuous.

8. The method of claim 1, further comprising rinsing the substrate after the forming, the grafting, and the filling.

9. A method for depositing a copper layer on a substrate surface, comprising:
   depositing a barrier layer and a copper seed layer on the substrate surface;
   grafting an organic layer on the substrate surface having the barrier layer and the copper seed layer; and
   electroplating copper on the substrate surface.

10. The method of claim 9, wherein grafting the organic layer comprises spinning on the substrate surface a solution containing a concentration of grafting molecules.

11. The method of claim 9, wherein the grafting molecules comprises one of a diazonium salt and a vinyl-monomer.

12. The method of claim 9, wherein grafting the organic layer comprises immersing the substrate in a grafting solution containing a concentration of grafting organic molecules and cathodically biasing the substrate surface.

13. The method of claim 9, further comprising rinsing the substrate after the depositing and the grafting.

14. The method of claim 9, wherein the copper seed layer is discontinuous.

* * * * *

UNITED STATES PATENT AND TRADEMARK OFFICE
CERTIFICATE OF CORRECTION

PATENT NO. : 7,504,335 B2 Page 1 of 1
APPLICATION NO. : 11/404058
DATED : March 17, 2009
INVENTOR(S) : Yang et al.

It is certified that error appears in the above-identified patent and that said Letters Patent is hereby corrected as shown below:

Column 3, Line 38, please delete "suicides" and insert --silicides-- therefor.

Signed and Sealed this

Second Day of June, 2009

JOHN DOLL
*Acting Director of the United States Patent and Trademark Office*